US012637769B2

(12) United States Patent
Basu et al.

(10) Patent No.: US 12,637,769 B2
(45) Date of Patent: May 26, 2026

(54) FILM FORMING METHOD AND FILM FORMING APPARATUS

(71) Applicant: Tokyo Electron Limited, Tokyo (JP)

(72) Inventors: Tuhin Shuvra Basu, Yamanashi (JP);
Hiroto Fujikawa, Yamanashi (JP);
Yutaka Motoyama, Yamanashi (JP);
Keita Kumagai, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 9 days.

(21) Appl. No.: 18/615,087

(22) Filed: Mar. 25, 2024

(65) Prior Publication Data

US 2024/0327984 A1     Oct. 3, 2024

(30) Foreign Application Priority Data

Mar. 31, 2023   (JP) ................................. 2023-058206

(51) Int. Cl.
*C23C 16/455*      (2006.01)
*C23C 16/24*       (2006.01)
*C23C 16/34*       (2006.01)
*C23C 16/40*       (2006.01)
*C23C 16/52*       (2006.01)

(52) U.S. Cl.
CPC ........ *C23C 16/45553* (2013.01); *C23C 16/24* (2013.01); *C23C 16/345* (2013.01); *C23C 16/402* (2013.01); *C23C 16/52* (2013.01)

(58) Field of Classification Search
CPC .............................................. C23C 16/45553
See application file for complete search history.

(56) References Cited

FOREIGN PATENT DOCUMENTS

JP          2017-175106     * 10/2017     ........... H01L 21/318

* cited by examiner

*Primary Examiner* — Dah-Wei D. Yuan
*Assistant Examiner* — Andrew J Bowman
(74) *Attorney, Agent, or Firm* — IPUSA, PLLC

(57) ABSTRACT

A film forming method for forming a silicon film on a substrate, includes preparing a substrate having a first film and a second film on a surface thereof, supplying a growth inhibiting gas that inhibits growth of the silicon film to the substrate, to cause physical adsorption of the growth inhibiting gas on the first film, and forming the silicon film on the first film and on the second film by supplying a silane-based gas having a silicon number 1 to the substrate having the growth inhibiting gas physically adsorbed on the first film.

5 Claims, 8 Drawing Sheets

FIG.1

START

S10

PREPARATION PROCESS

S20

GROWTH INHIBITION PROCESS

S30

FILM FORMING PROCESS

END

FIG.2A
105  102      103  106
104
101
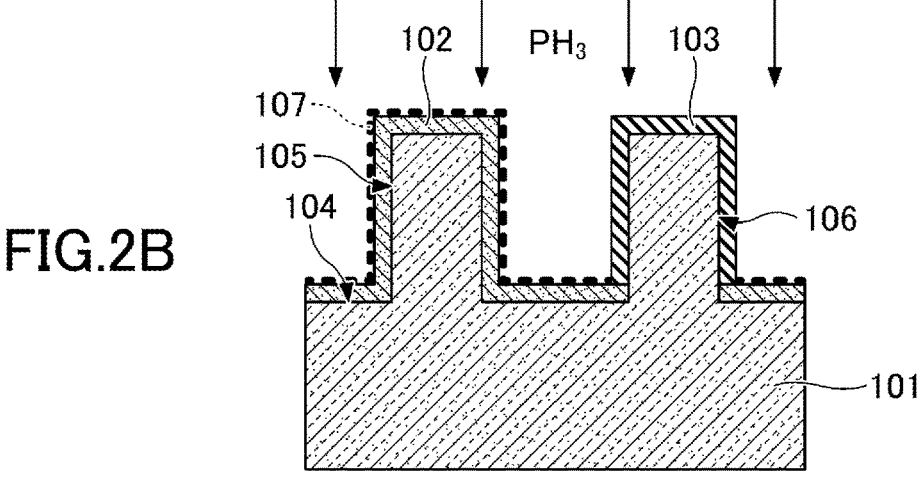
FIG.2B
102    PH₃    103
107
105
104                106
101
FIG.2C
102  108      103
105
104                106
101
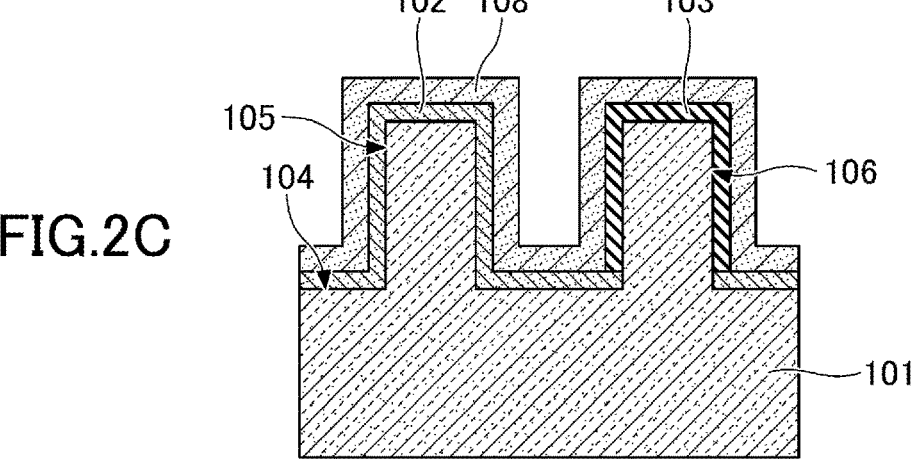

| ⦷ – Si atom | ⊗ – H atom | ⦷ – P atom | ✶ – dangling bond |
|---|---|---|---|

| ⦷ – Si atom | ⊗ – H atom | ⦷ – P atom | ✶ – dangling bond |
|---|---|---|---|

| ⊚ – Si atom | ⊙ – H atom | ⊛ – P atom | * – dangling bond |

| ⊚ – Si atom | ⊙ – H atom | ⊛ – P atom | * – dangling bond |

| | | | | |
|---|---|---|---|---|
| ⊘ − Si atom | ⊚ − H atom | ⊛ − P atom | ● − O atom | * − dangling bond |

| | | | | |
|---|---|---|---|---|
| ⊘ − Si atom | ⊚ − H atom | ⊛ − P atom | ● − O atom | * − dangling bond |

| ◎ – Si atom | ⊙ – H atom | ◉ – P atom | ● – O atom | ✳ – dangling bond |
|---|---|---|---|---|

| ◎ – Si atom | ⊙ – H atom | ◉ – P atom | ● – O atom | ✳ – dangling bond |
|---|---|---|---|---|

GAS SUPPLY TIME

GAS SUPPLY TIME

FILM FORMING METHOD AND FILM FORMING APPARATUS

CROSS-REFERENCE TO RELATED APPLICATIONS

This application is based upon and claims priority to Japanese Patent Application No. 2023-058206, filed on Mar. 31, 2023, the entire contents of which are incorporated herein by reference.

BACKGROUND

1. Field of the Invention

The present disclosure relates to film forming methods and film forming apparatuses.

2. Description of the Related Art

A technique is known in which a seed layer is formed by nitriding surface layers of a SiO film and a first SiN film exposed on a substrate surface, and thereafter forming a second SiN film by atomic layer deposition (ALD), so that a growth rate of the second SiN film is the same at the surface of the SiO film and the surface of the first SiN film (refer to Japanese Laid-Open Patent Publication No. 2017-175106, for example).

SUMMARY

One aspect of the present disclosure provides a technique capable of controlling a difference in film thicknesses between a silicon film formed on a first film and a silicon film formed on a second film when simultaneously forming the silicon films on the first film and the second film.

A film forming method for forming a silicon film on a substrate according to one aspect of the present disclosure includes preparing a substrate having a first film and a second film on a surface thereof; supplying a growth inhibiting gas that inhibits growth of the silicon film to the substrate, to cause physical adsorption of the growth inhibiting gas on the first film; and forming the silicon film on the first film and on the second film by supplying a silane-based gas having a silicon number 1 to the substrate having the growth inhibiting gas physically adsorbed on the first film.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF THE DRAWINGS

FIG. 1 is a flow chart illustrating a film forming method according to one embodiment;

FIG. 2A, FIG. 2B, and FIG. 2C are cross sectional views illustrating the film forming method according to one embodiment;

DETAILED DESCRIPTION

Figure 3A:
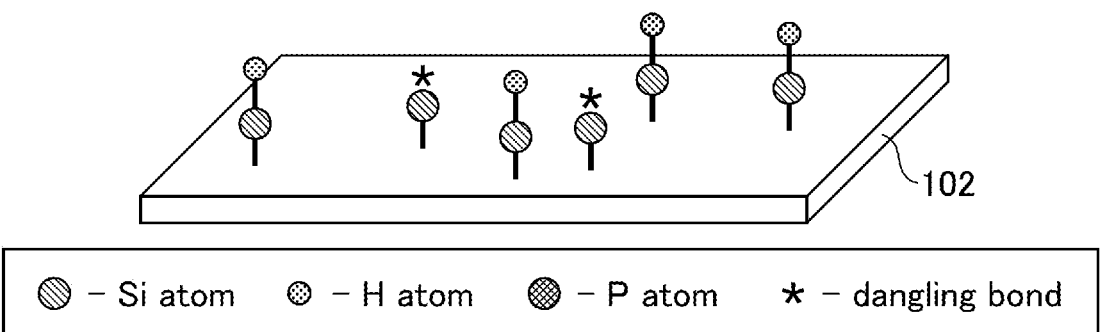
FIG. 3A, FIG. 3B, FIG. 3C, and FIG. 3D are diagrams illustrating a surface reaction when a a-Si film is formed on a a-Si film.

Non-limiting embodiments and exemplary implementations of the present disclosure will be described below with reference to the accompanying drawings. In all the accompanying drawings, the same or corresponding members or parts are designated by the same or corresponding reference numerals, and a redundant description thereof will be omitted.

[Film Forming Method]

Figure 1:
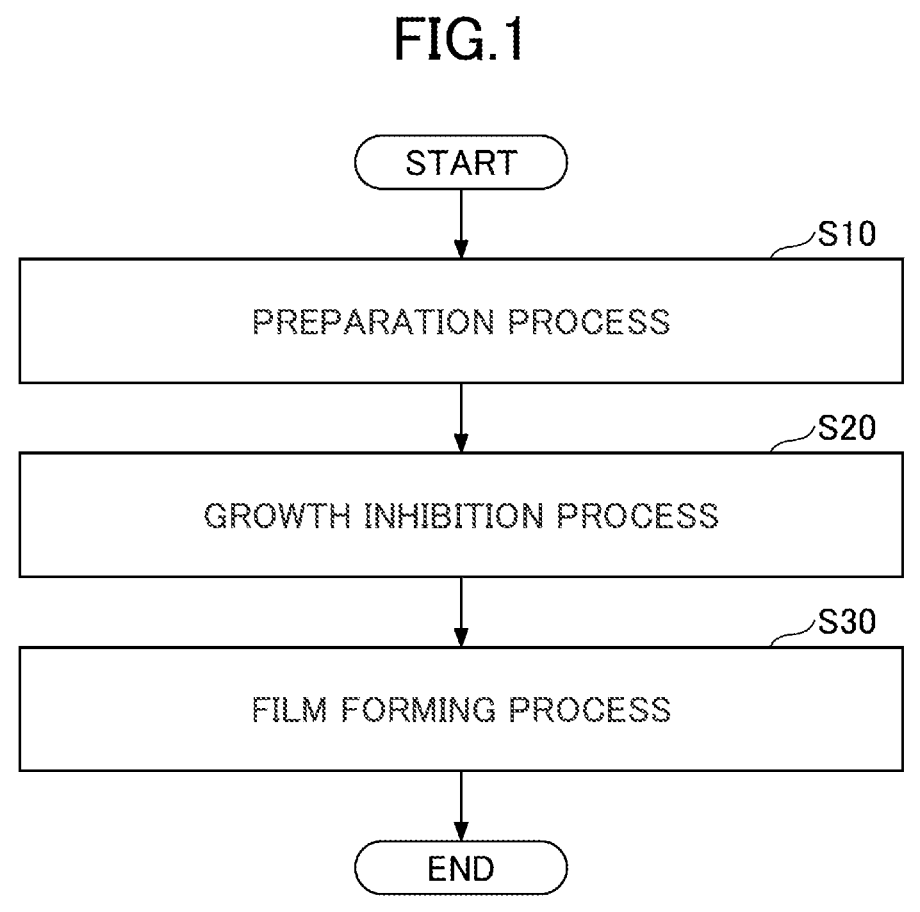

A film forming method according to one embodiment will be described with reference to FIG. 1 and FIG. 2A through FIG. 2C. As illustrated in FIG. 1, the film forming method according to one embodiment includes a preparation process (or step) S10, a growth inhibition process (or step) S20, and a film forming process (or step) S30.

The preparation process S10 includes preparing a substrate 101 illustrated in FIG. 2A. The substrate 101 is a semiconductor wafer, such as a silicon wafer or the like, for example. The substrate 101 has an amorphous silicon film (a-Si film) 102 and a silicon oxide film ($SiO_2$ film) 103 on formed on a surface thereof. The a-Si film 102 is an example of a first film. The $SiO_2$ film 103 is an example of a second film. The substrate 101 has a flat portion 104, a first columnar portion 105, and a second columnar portion 106 on the surface thereof. The first columnar portion 105 and the second columnar portion 106 are provided on the flat portion 104. A plurality of first columnar portions 105 may be provided on the flat portion 104. In addition, a plurality of second columnar portions 106 may be provided on the flat portion 104. The a-Si film 102 covers the flat portion 104 and the first columnar portion 105. The $SiO_2$ film 103 covers the second columnar portion 106. The substrate 101 does not necessarily have to include the first columnar portion 105 and the second columnar portion 106. In this case, the a-Si film 102 and the $SiO_2$ film 103 are provided on the flat portion 104 at mutually different regions (or areas) thereof. The preparation process S10 may include adjusting and maintaining the substrate 101 at a predetermined temperature. The predetermined temperature may be the same as a processing temperature of the growth inhibition process S20. In this case, the temperature does not need to be changed when the process advances from the preparation process S10 to the growth inhibition process S20, thereby improving productivity.

The growth inhibition process S20 is performed after the preparation process S10. The growth inhibition process S20 includes adjusting and maintaining the substrate 101 at a first processing temperature. The growth inhibition process S20 includes supplying a phosphine ($PH_3$) gas to the substrate 101. The phosphine gas is an example of a growth inhibiting gas. As illustrated in FIG. 2B, the phosphine gas is selectively and physically adsorbed on the surface of the a-Si film 102, but is hardly physically adsorbed on the surface of the $SiO_2$ film 103 for reasons which will be described later. The first processing temperature is preferably lower than a thermal decomposition temperature of the phosphine gas. In this case, because chemical adsorption of the phosphine gas with respect to the surface of the a-Si film 102 can be prevented, the phosphine gas present on the surface of the a-Si film 102 can easily be removed in the film forming process S30. For this reason, phosphorus (P) included in the phosphine gas can be prevented from remaining in a a-Si film 108 which will be described later. As a result, properties of the a-Si film 108 are unaffected by the phosphorus (P). The first processing temperature is 470° C., for example.

The film forming process S30 is performed after the growth inhibition process S20. The film forming process S30 includes adjusting and maintaining the substrate 101 at a second processing temperature. The film forming process S30 includes supplying a monosilane (SiH$_4$) gas to the substrate 101, so as to form the a-Si film 108 on the a-Si film 102 and on the SiO$_2$ film 103. The monosilane gas is an example of a silane-based gas having a silicon number 1. A predetermined time is required from a time when the supply of the monosilane gas with respect to the SiO$_2$ film 103 starts to a time when the film formation starts. When the supply of the monosilane gas to the a-Si film 102 starts, the film formation starts immediately after the monosilane gas is supplied. However, in the case where PH$_3$ is physically adsorbed on the surface, the time it takes for the film formation to start from the time when the supply of the monosilane gas starts becomes longer as an amount of the physically adsorbed PH$_3$ increases. In the film forming process S30, because PH$_3$ is physically adsorbed on the a-Si film 102, a difference between a thickness of the a-Si film 108 formed on the a-Si film 102 and a thickness of the a-Si film 108 formed on the SiO$_2$ film 103 is small, compared to the case where PH$_3$ is not physically adsorbed on the a-Si film 102. The second processing temperature may be a temperature that is higher than or equal to the thermal decomposition temperature of the monosilane gas and lower than or equal to 600° C. The second processing temperature may be the same as the first processing temperature, and is 470° C., for example.

Figure 3B:
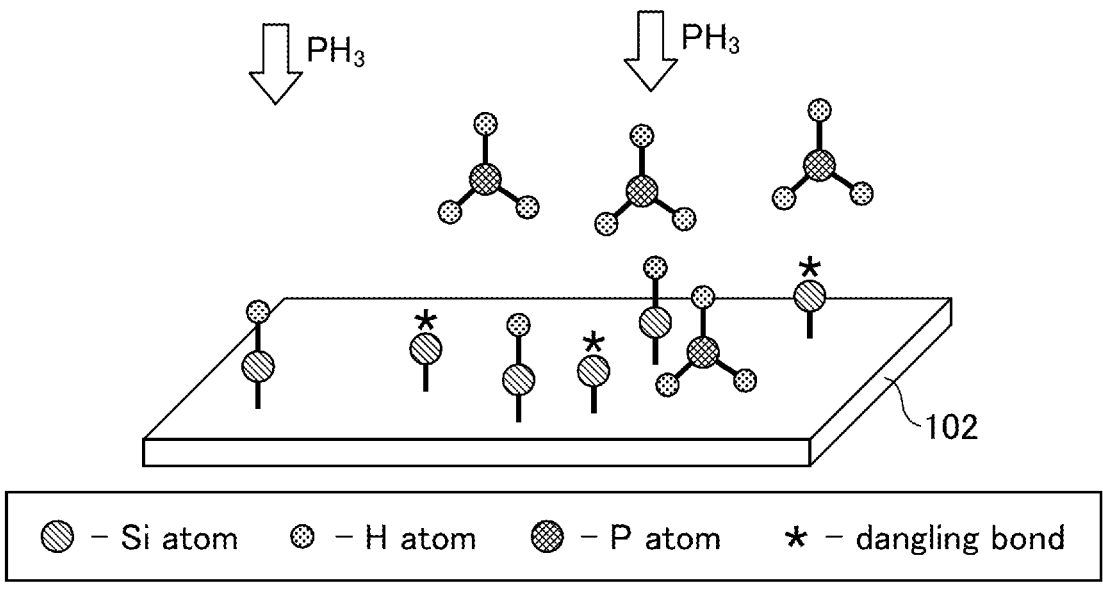

A surface reaction for the case where the a-Si film 108 is formed on the a-Si film 102 will be described, by referring to FIG. 3A through FIG. 3D. As illustrated in FIG. 3A, the surface of the a-Si film 102 is formed of silicon (Si) having Si—H bonds or dangling bonds. Phosphine (PH$_3$) is easily adsorbed on the surface formed of the silicon having the Si—H bonds or the dangling bonds. Hence, as illustrated in FIG. 3B, when the phosphine gas is supplied with respect to the a-Si film 102 during the growth inhibition process S20, PH$_3$ is physically adsorbed on the surface of the a-Si film 102.

Figure 3C:
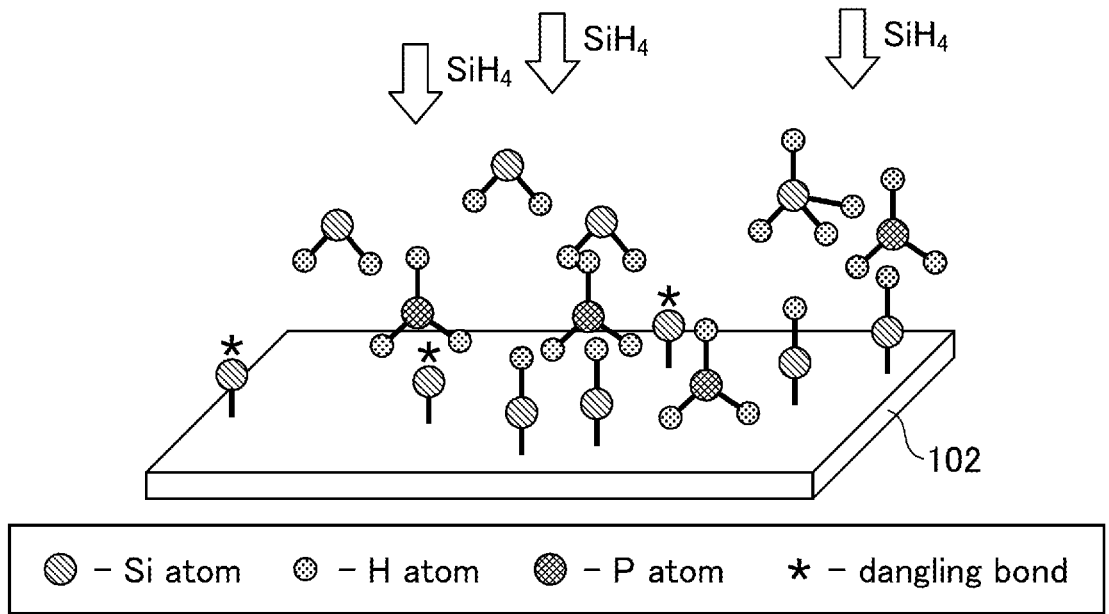
Figure 3D:
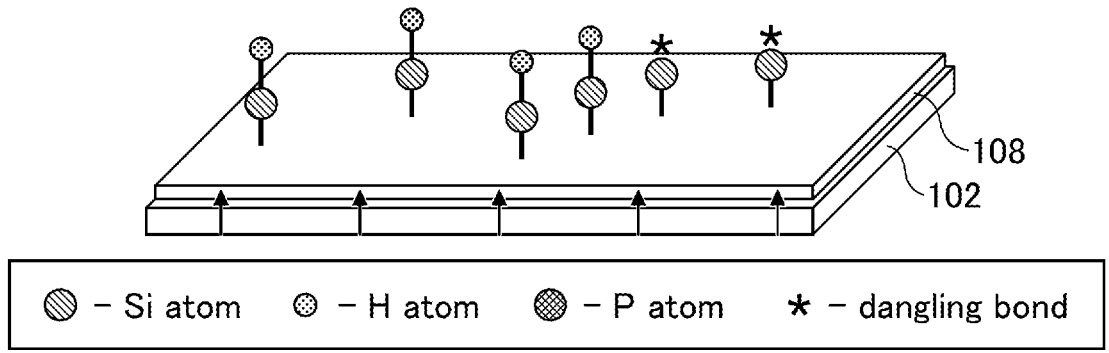

Next, as illustrated in FIG. 3C, when the monosilane gas is supplied during the film forming process S30, the monosilane gas is thermally decomposed to generate SiH$_2$ radicals. The SiH$_2$ radicals extract the hydrogen (H) existing at the surface of the a-Si film 102 to return to the SiH$_4$ and generate dangling bonds. In the case where PH$_3$ is not physically adsorbed on the surface of the a-Si film 102, other SiH$_2$ radicals are adsorbed on the dangling bonds to start the formation of the a-Si film 108. On the other hand, in the case where PH$_3$ is physically adsorbed on the surface of the a-Si film 102, the adsorption of the SiH$_2$ radicals to the dangling bonds is inhibited by the PH$_3$. In this case, when the SiH$_2$ radicals continue to be supplied to the surface of the a-Si film 102, desorption of the PH$_3$ from the surface of the a-Si film 102 occurs. When the desorption of the PH$_3$ from the surface of the a-Si film 102 occurs, the SiH$_2$ radicals extract the hydrogen (H) present at the surface of the a-Si film 102, and return to SiH$_4$, and the dangling bonds are easily generated. As a result, other SiH$_2$ radicals are adsorbed on the dangling bonds to start the formation of the a-Si film 108, as illustrated in FIG. 3D.

With respect to the a-Si film 102 having the PH$_3$ physically adsorbed on the surface thereof, a long time (hereinafter also referred to as "an incubation time") is required from a time when the supply of the monosilane gas is started to a time when the formation of the a-Si film 108 is started. The incubation time becomes longer as the amount of PH$_3$ physically adsorbed on the surface of the a-Si film 102 becomes larger. Accordingly, by varying the supply time of the phosphine gas with respect to the substrate 101 during the growth inhibition process S20, it is possible to control the incubation time of the a-Si film 108 with respect to the a-Si film 102.

Figure 4A:
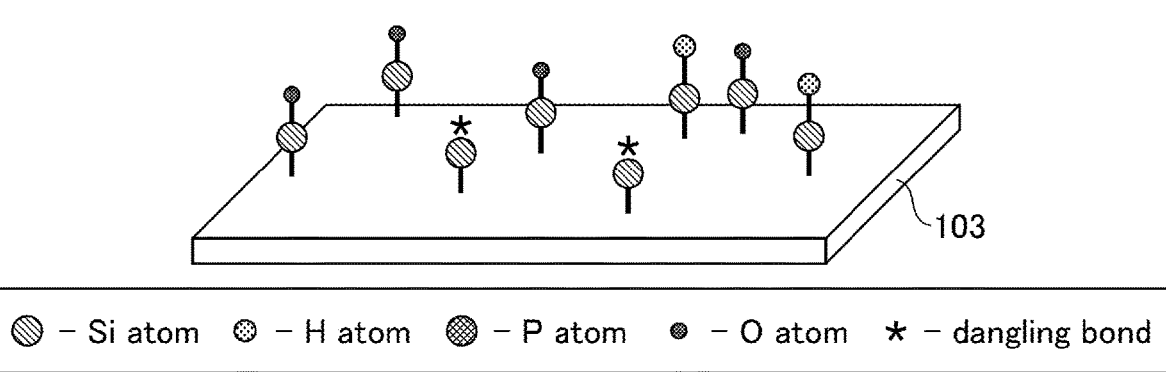
FIG. 4A, FIG. 4B, FIG. 4C, and FIG. 4D are diagrams illustrating a surface reaction when a a-Si film is formed on a $SiO_2$ film.
Figure 4B:
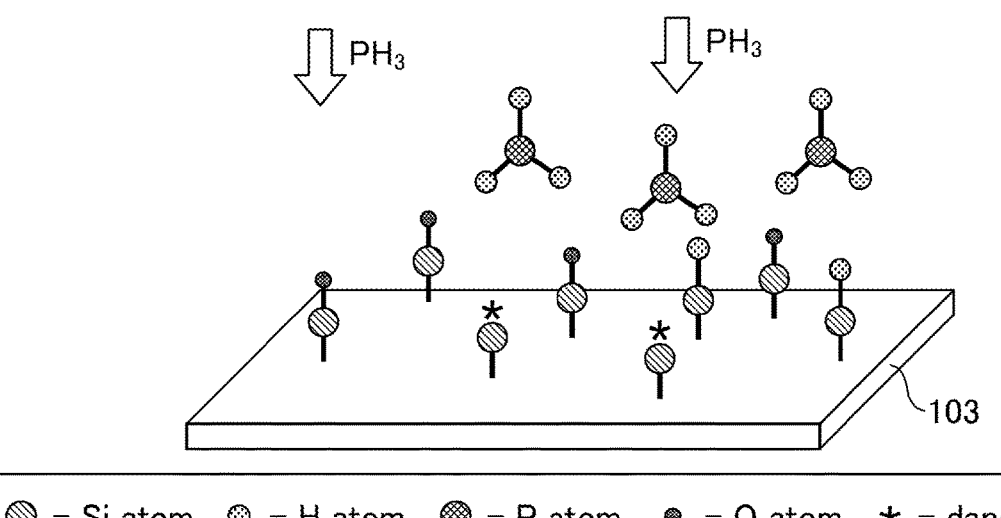

The surface reaction for the case where the a-Si film 108 is formed on the SiO$_2$ film 103 will be described, by referring to FIG. 4A through FIG. 4D. As illustrated in FIG. 4A, a large number of Si—O bonds are present at the surface of the SiO$_2$ film 103, and the number silicon (Si) having the Si—H bonds or dangling bonds is small compared to the surface of the a-Si film 102. The Si—O bonds have a function to inhibit the SiH$_2$ radicals from extracting the hydrogen (H). For this reason, the time required from the time when the supply of the monosilane gas to the SiO$_2$ film 103 is started to the time when the formation of the a-Si film 108 is started, is longer than the time required from the time when the supply of the monosilane gas to the a-Si film 102 is started to the time when the formation of the a-Si film 108 is started. The Si—O bonds have a function to inhibit physical adsorption of the PH$_3$. Accordingly, even if the surface of the SiO$_2$ film 103 were exposed to the phosphine gas during the growth inhibition process S20, the PH$_3$ is hardly physically adsorbed on the surface of the SiO$_2$ film 103, as illustrated in FIG. 4B.

Figure 4C:
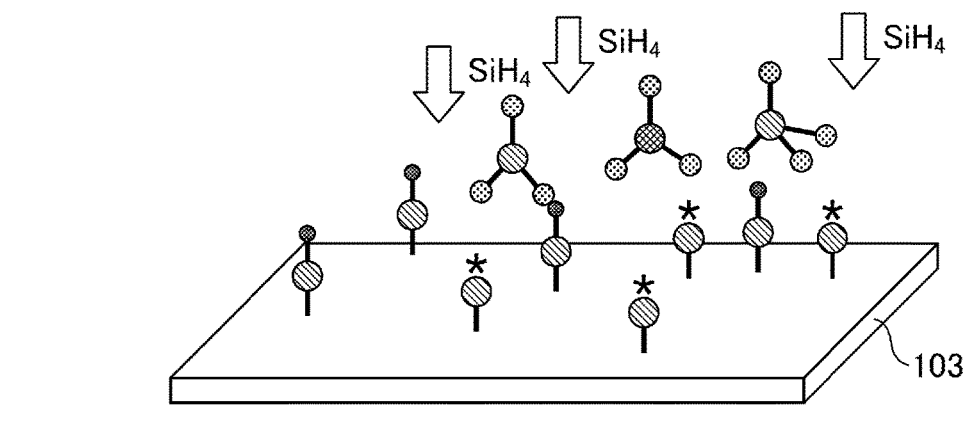
Figure 4D:
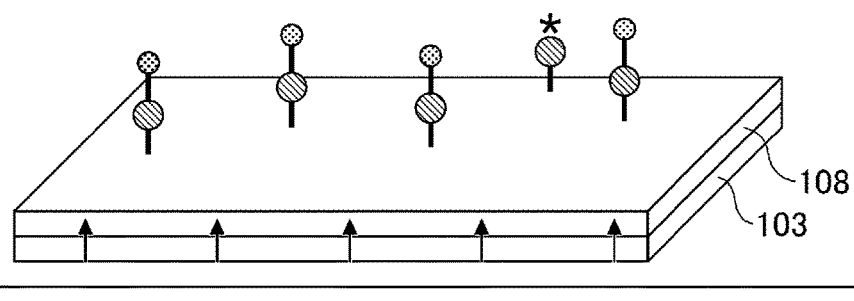

Next, as illustrated in FIG. 4C, when the monosilane gas is supplied during the film forming process S30, the monosilane gas is thermally decomposed to generate SiH$_2$ radicals. The SiH$_2$ radicals extract the hydrogen (H) existing at the surface of the SiO$_2$ film 103 to return to the SiH$_4$ and generate the dangling bonds. In this case, because a large number of Si—O bonds are present at the surface of the SiO$_2$ film 103 while only a small number of Si—H bonds are present at the surface, hydrogen (H) is less likely to be extracted by the SiH$_2$ radicals. As described above, at the surface of the SiO$_2$ film 103, the time required from the time when the supply of the monosilane gas is started to the time when the growth of the a-Si film 108 is started is long regardless of the presence or absence of the physically adsorbed PH$_3$, as illustrated in FIG. 4D.

As described above, according to the film forming method of one embodiment, the phosphine gas is supplied to the substrate 101 having the a-Si film 102 and the SiO$_2$ film 103 on the surface thereof, to physically adsorb the PH$_3$ on the surface of the a-Si film 102. Thereafter, the monosilane gas is supplied to form the a-Si film 108 on the a-Si film 102 and on the SiO$_2$ film 103. Thus, the a-Si film 108 having a small thickness difference can be formed simultaneously on the a-Si film 102 and on the SiO$_2$ film 103.

According to the film forming method of one embodiment, the incubation time of the a-Si film 108 with respect to the a-Si film 102 can be controlled by varying the supply time of the phosphine gas with respect to the substrate 101. In this case, the incubation time of the a-Si film 108 with respect to the SiO$_2$ film 103 hardly varies. For this reason, it is possible to control the thickness difference between the a-Si film 108 formed on the a-Si film 102 and the a-Si film 108 formed on the SiO$_2$ film 103.

[Film Forming Apparatus]

Figure 5:
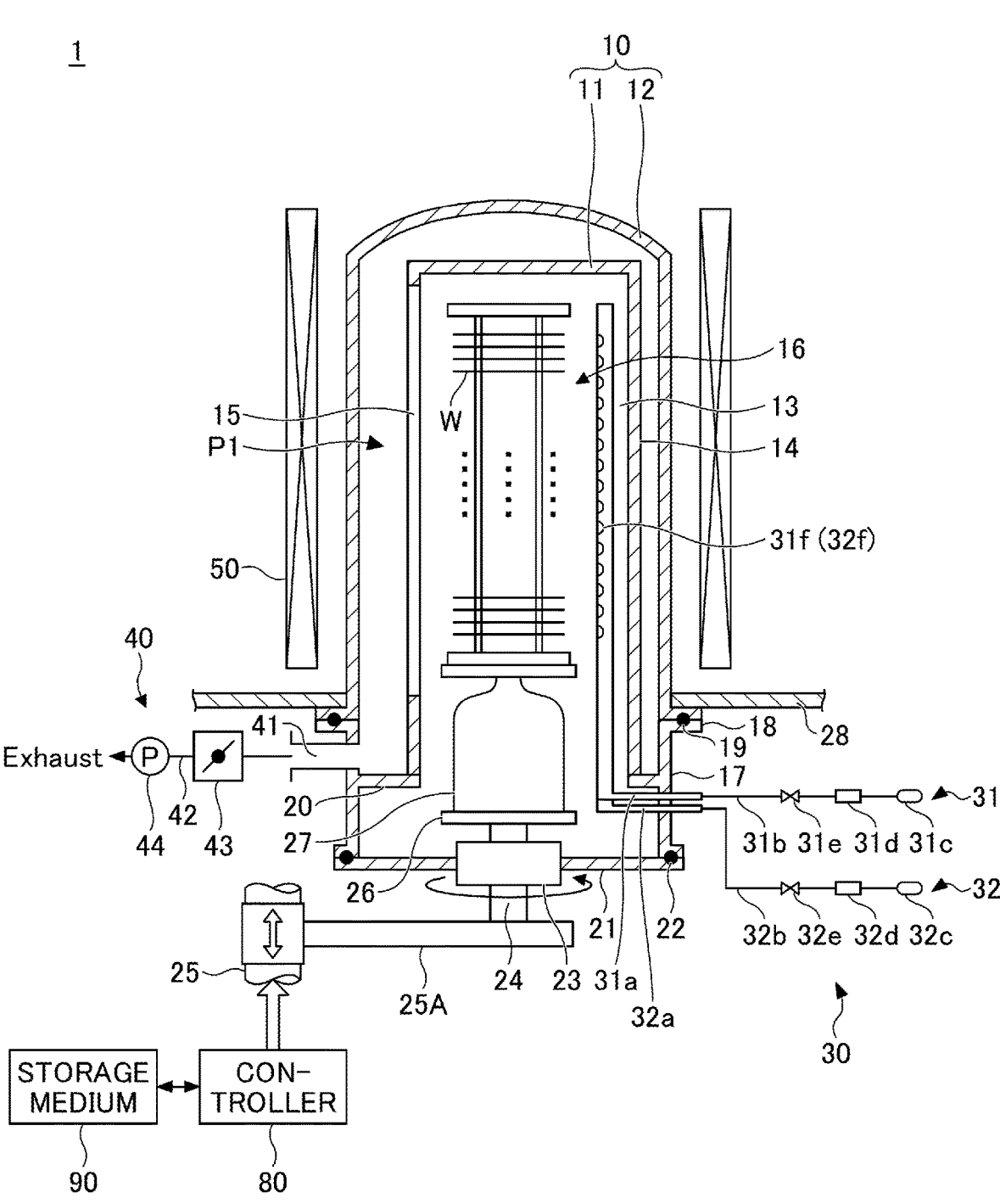
FIG. 5 is a cross sectional view illustrating a film forming apparatus according to one embodiment.

A film forming apparatus 1 according to the embodiment will be described with reference to FIG. 5. As illustrated in FIG. 5, the film forming apparatus 1 is a batch-type apparatus that simultaneously performs processes on a plurality of substrates W.

The film forming apparatus 1 includes a processing chamber 10, a gas supply 30, an exhaust 40, a heater 50, and a controller 80.

The inside of the processing chamber 10 can be depressurized. The processing chamber 10 accommodates the substrates W therein. The processing chamber 10 includes an inner tube 11 and an outer tube 12. The inner tube 11 and the outer tube 12 have a cylindrical shape with a ceiling and an open lower end. The outer tube 12 covers an outside of the inner tube 11. The inner tube 11 and the outer tube 12 have a coaxially arranged double tube structure. The inner tube 11 and the outer tube 12 are formed of a heat resistant material, such as quartz or the like.

The ceiling of the inner tube 11 may be flat, for example. An accommodating part 13 for accommodating gas nozzles along a longitudinal direction (vertical direction) thereof is formed on one side of the inner tube 11. For example, a part of a sidewall of the inner tube 11 protrudes outward to form a protrusion 14, and the inside of the protrusion 14 is formed as the accommodating part 13.

A rectangular opening 15 is formed in the sidewall of the inner tube 11 on the opposite side opposing the accommodating part 13 along the longitudinal direction (vertical direction) thereof.

The opening 15 is a gas exhaust port formed to enable the gas inside the inner tube 11 to be exhausted. A length of the opening 15 is the same as a length of a boat 16, or is formed to be longer than the length of the boat 16 by extending in the vertical direction.

A lower end of the processing chamber 10 is supported by a cylindrical manifold 17. The manifold 17 is formed of stainless steel, for example. A flange 18 is formed on an upper end of the manifold 17. The flange 18 supports the lower end of the outer tube 12. A seal member 19, such as an O-ring or the like, is provided between the flange 18 and the lower end of the outer tube 12. Thus, the inside of the outer tube 12 is maintained airtight.

An annular support 20 is provided on an inner wall at an upper portion of the manifold 17. The support 20 supports the lower end of the inner tube 11. A lid 21 is attached airtight to an opening at the lower end of the manifold 17 via a seal member 22, such as an O-ring or the like. Thus, the opening at the lower end of the processing chamber 10, that is, the opening of the manifold 17, is closed airtight. The lid 21 is formed of stainless steel, for example.

A rotating shaft 24 is provided to penetrate a center of the lid 21 via a magnetic fluid seal 23. A lower portion of the rotating shaft 24 is rotatably supported on an arm 25A of an elevator mechanism 25 including a boat elevator.

A rotary plate 26 is provided on an upper end of the rotating shaft 24. The boat 16, configured to hold the substrates W via a quartz insulating table 27, is placed on the rotary plate 26. The boat 16 is rotated by rotating the rotating shaft 24. The boat 16 moves up and down (vertically) integrally with the lid 21, by raising and lowering the elevator mechanism 25. Thus, the boat 16 is inserted into and removed, that is, loaded into and unloaded from the processing chamber 10. The boat 16 can be accommodated inside the processing chamber 10. The boat 16 holds the plurality of (for example, 50 to 150) substrates W in an approximately horizontal state at intervals along the vertical direction.

The gas supply 30 is configured to introduce various processing gases used in the film forming method described above into the inner tube 11. The gas supply 30 includes a phosphene supply 31, and a monosilane supply 32.

The phosphene supply 31 includes a phosphene supply pipe 31a inside the processing chamber 10, and a phosphene supply path 31b outside the processing chamber 10. The phosphene supply path 31b is provided with a phosphene source 31c, a mass flow controller 31d, and a valve 31e in this order from an upstream side to a downstream side along a gas flowing direction. Thus, a supply timing of the phosphene gas from the phosphene source 31c is controlled by the valve 31e, and a flow of the phosphene gas is adjusted to a predetermined flow rate by the mass flow controller 31d. The phosphene gas flows from the phosphene supply path 31b to the phosphene supply pipe 31a, and is discharged from the phosphene supply pipe 31a into the processing chamber 10.

The monosilane supply 32 includes a monosilane supply pipe 32a inside the processing chamber 10, and a monosilane supply path 32b outside the processing chamber 10. A monosilane source 32c, a mass flow controller 32d, and a valve 32e are provided in the monosilane supply path 32b in this order from an upstream side to a downstream side along a gas flowing direction. Thus, a supply timing of the monosilane gas from the monosilane source 32c is controlled by the valve 32e, and a flow of the monosilane gas is adjusted to a predetermined flow rate by the mass flow controller 32d. The monosilane gas flows from the monosilane supply path 32b to the monosilane supply pipe 32a, and is discharged from the monosilane supply pipe 32a into the processing chamber 10.

Each of the gas supply pipes (the phosphene supply pipe 31a and the monosilane supply pipe 32a) is fixed to the manifold 17. Each of the gas supply pipes is formed of quartz, for example. Each of the gas supply pipes extends linearly along the vertical direction at a position near the inner tube 11, and is bent in an L shape inside the manifold 17 to extend in a horizontal direction so as to penetrate the manifold 17. The gas supply pipes are arranged in a circumferential direction of the inner tube 11, and are formed to the same height.

A plurality of phosphene discharge ports 31f are provided in a portion of the phosphene supply pipe 31a located inside the inner tube 11. A plurality of monosilane discharge ports 32f are provided in a portion of the monosilane supply pipe 32a located inside the inner tube 11.

The discharge ports (the phosphene discharge ports 31f and the monosilane discharge ports 32f) are formed at predetermined intervals along the direction in which the corresponding gas supply pipe extends. Each of the discharge ports discharges the gas in the horizontal direction. The interval between the adjacent discharge ports is set to be the same as the interval between the adjacent substrates W held by the boat 16, for example. The position of each discharge port along a height direction is set to an intermediate position between the adjacent substrates W that are adjacent to each other along the vertical direction. Hence, each discharge port can efficiently supply the gas to an opposing surface between the adjacent substrates W.

The gas supply 30 may mix a plurality of kinds of gases and discharge the mixed gas from a single gas supply pipe. The gas supply pipes (the phosphene supply pipe 31a and the monosilane supply pipe 32a) may have mutually different shapes and arrangements. The film forming apparatus 1 may further include a gas supply pipe configured to supply another gas, in addition to the phosphene gas and the monosilane gas.

The exhaust 40 exhausts the gas discharged from the inside of the inner tube 11 through the opening 15, and discharged from a gas outlet 41 through a space P1 between the inner tube 11 and the outer tube 12. The gas outlet 41 is formed in a sidewall at the upper portion of the manifold 17 above the support 20. An exhaust passage 42 is connected to the gas outlet 41. A pressure regulating valve 43 and a vacuum pump 44 are successively provided in the exhaust passage 42, so that the gas inside of the processing chamber 10 can be exhausted.

The heater 50 is provided around the outer tube 12. The heater 50 is provided on a base plate 28, for example. The heater 50 has a cylindrical shape so as to cover the outer tube 12. The heater 50 includes a heating element, for example, and heats each of the substrates W inside the processing chamber 10.

The controller 80 controls the operation of various parts or components of the film forming apparatus 1. The controller 80 may be a computer, for example. A program which, when executed by the computer, causes the computer to perform the operations of the various parts or components of the film forming apparatus 1, is stored in the storage medium 90. The storage medium 90 may be a flexible disk, a compact disk, a hard disk, a flash memory, a digital versatile disk (DVD), or the like. The storage medium 90 may be any suitable non-transitory computer-readable storage medium capable of storing one or more programs.

[Operation of Film Forming Apparatus]

The operations of the film forming apparatus 1 when performing the film forming method according to the embodiment will be described.

First, the controller 80 controls the elevator mechanism 25 to load the boat 16 holding the plurality of substrates W into the processing chamber 10, and closes the opening at the lower end of the processing chamber 10 with the lid 21 to seal the processing chamber 10 airtight. Then, the controller 80 controls the exhaust 40 to depressurize the inside of the processing chamber 10, and controls the heater 50 to adjust the temperature of the substrates W to the first processing temperature. Each of the substrates W may be the substrate 101 described above.

Next, the controller 80 controls the gas supply 30, exhaust 40, and the heater 50 so as to perform the growth inhibition process S20. More particularly, first, the controller 80 controls the gas supply 30 to supply the phosphene gas into the processing chamber 10 in a state where the temperature of the substrates W is maintained at the first processing temperature by controlling the heater 50, and controls the exhaust 40 to maintain the inside of the processing chamber 10 at a processing pressure. Thus, the phosphene gas is selectively and physically adsorbed on the surface of the a-Si film 102.

Next, the controller 80 controls the gas supply 30, the exhaust 40, and the heater 50 so as to perform the film forming process S30. More particularly, first, the controller 80 controls the gas supply 30 to supply the monosilane gas into the processing chamber 10 in a state where the temperature of the substrates W is maintained at the second processing temperature by controlling the heater 50, and controls the exhaust 40 to maintain the inside of the processing chamber 10 at a processing pressure. Hence, the a-Si film 108 having a small thickness difference can be formed on the a-Si film 102 and on the SiO$_2$ film 103.

Next, the controller 80 raises the pressure inside the processing chamber 10 to the atmospheric pressure, and lowers the temperature inside the processing chamber 10 to an unloading temperature, before controlling the elevator mechanism 25 to unload the boat 16 from the processing chamber 10.

EXEMPLARY IMPLEMENTATIONS

Exemplary Implementation EI1

In an exemplary implementation EI1, a substrate having a a-Si film on a surface thereof was prepared. Next, the prepared substrate was accommodated inside the processing chamber 10 of the film forming apparatus 1, and the growth inhibition process S20 and the film forming process S30 were performed in this order. During the growth inhibition process S20, a phosphine gas was supplied to the substrate while the substrate temperature was maintained at 470° C. During the film forming process S30, a monosilane gas was supplied to the substrate while the substrate temperature was maintained at 470° C. In the exemplary implementation EI1, the a-Si film was formed under a plurality of conditions in which the supply times of the monosilane gas to the substrate during the film forming process S30 were different. Next, the thicknesses of the a-Si films formed under the plurality of conditions were measured.

Comparative Example CE1

In a comparative example CE1, the prepared substrate was accommodated inside the processing chamber 10 of the film forming apparatus 1, and the film forming process S30 was performed without performing the growth inhibition process S20. During the film forming process S30, the a-Si film was formed under the same conditions as the exemplary implementation EI1. Next, the thicknesses of the a-Si films formed under the plurality of conditions were measured.

Figure 6:
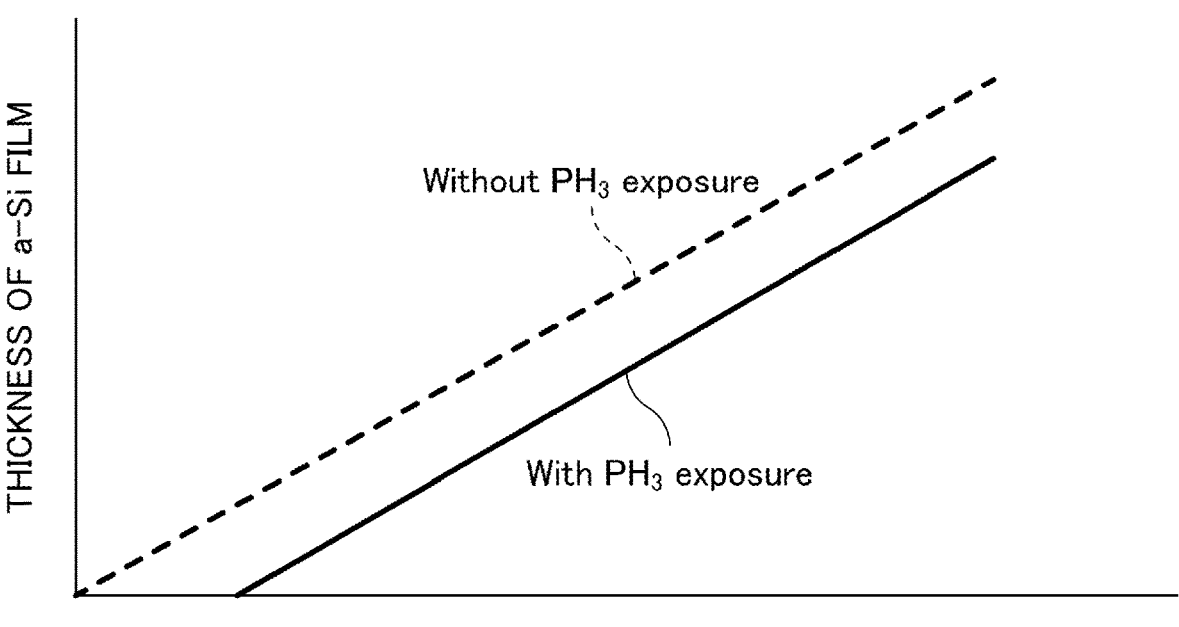
FIG. 6 is a diagram illustrating a relationship between a gas supply time and a film thickness when the a-Si film is formed on the a-Si film.

FIG. 6 is a diagram illustrating a relationship between the gas supply time and the film thickness when the a-Si film is formed on the a-Si film. In FIG. 6, the abscissa represents the gas supply time, and the ordinate represents the film thickness of the a-Si film. FIG. 6 illustrates a solid straight line connecting points obtained by plotting the film thicknesses of the plurality of a-Si films measured in the exemplary implementation EI1, and a broken straight line connecting points obtained by plotting the film thicknesses of the plurality of a-Si films measured in the comparative example CE1.

As illustrated by the solid line in FIG. 6, in the exemplary implementation EI1, the formation of the a-Si film is started after a predetermined time X1 elapses from the time when the supply of the monosilane gas is started. In contrast, as illustrated by the broken line in FIG. 6, in the comparative example CE1, the formation of the a-Si film is started immediately after the supply of the monosilane gas is started. From these results, it was found that the time required from the time when the supply of the monosilane gas to the substrate is started to the time when the formation of the a-Si film is started can be increased by performing the growth inhibition process S20 before the film forming process S30.

Exemplary Implementation EI2

In an exemplary implementation EI2, a substrate having a SiO$_2$ film on a surface thereof was prepared. Next, the prepared substrate was accommodated inside the processing chamber 10 of the film forming apparatus 1, and the growth inhibition process S20 and the film forming process S30 were performed in this order. During the growth inhibition process S20, the phosphine gas was supplied to the substrate while the substrate temperature was maintained at 470° C. During the film forming process S30, the monosilane gas was supplied to the substrate while the substrate temperature was maintained at 470° C. In the exemplary implementation EI2, the a-Si film was formed under a plurality of conditions in which the supply times of the monosilane gas to the substrate during the film forming process S30 were different. Next, the thicknesses of the a-Si films formed under the plurality of conditions were measured.

Comparative Example CE2

In a comparative example CE2, the prepared substrate was accommodated inside the processing chamber 10 of the film forming apparatus 1, and the film forming process S30 was performed without performing the growth inhibition process S20. During the film forming process S30, the a-Si film was formed under the same conditions as the exemplary implementation EI2. Next, the thicknesses of the a-Si films formed under the plurality of conditions were measured.

Figure 7:
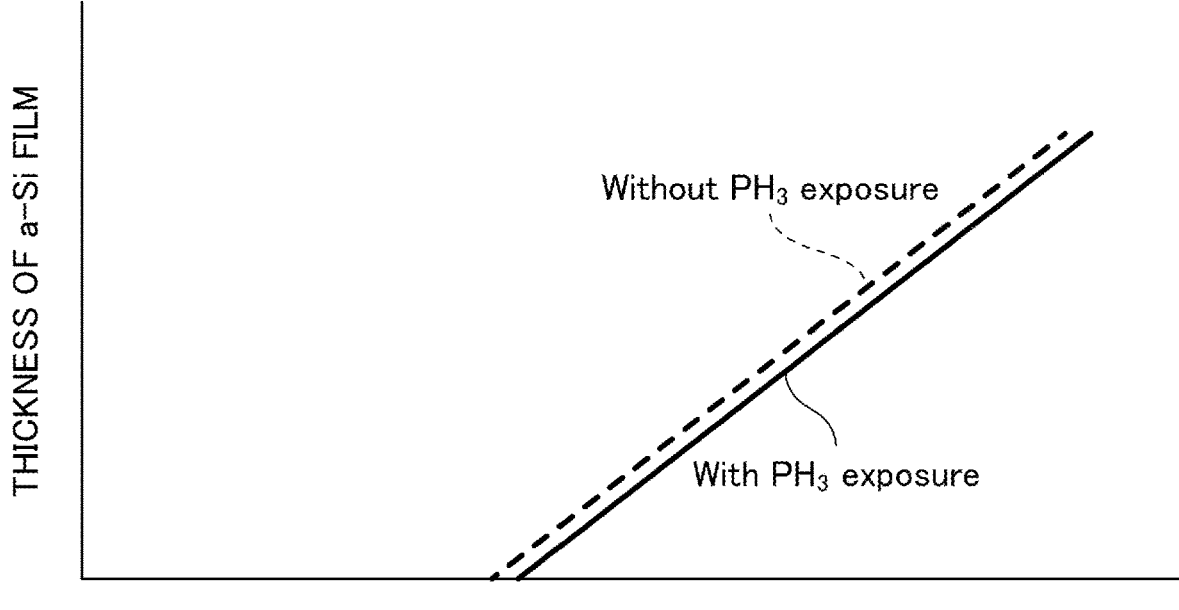
FIG. 7 is a diagram illustrating a relationship between a gas supply time and a thickness of the a-Si film formed on the $SiO_2$ film.

FIG. 7 is a diagram illustrating a relationship between the gas supply time and the thickness of the a-Si film formed on the $SiO_2$ film. In FIG. 7, the abscissa represents the gas supply time, and the ordinate represents the film thickness of the a-Si film. FIG. 7 illustrates a solid straight line connecting points obtained by plotting the film thicknesses of the plurality of a-Si films measured in the exemplary implementation EI2, and a broken straight line connecting points obtained by plotting the film thicknesses of the plurality of a-Si films measured in the comparative example CE1.

As illustrated by the solid line in FIG. 7, in the exemplary implementation EI2, the formation of the a-Si film is started after a predetermined time X2 elapses from the time when the supply of the monosilane gas is started. In contrast, as illustrated by the broken line in FIG. 7, in the comparative example CE2, the formation of the a-Si film is started after a predetermined time Y2 elapses from the time when the supply of the monosilane gas is started. It was also found that the predetermined time Y2 is approximately the same as the predetermined time X2. From these results, it was found that, in the case where the a-Si film is formed on the $SiO_2$ film, the time required from the time when the supply of the monosilane gas to the substrate is started to the time when the formation of the a-Si film is started remains substantially unchanged even if the $SiO_2$ film is exposed to the phosphine gas before the monosilane gas is supplied.

The embodiments disclosed herein are to be considered in all respects as illustrative and not restrictive. The embodiments described above may include omissions, substitutions, and modifications in various forms without departing from the scope and spirit of the subject matter of the present disclosure.

In the embodiments described above, the growth inhibiting gas is the phosphine gas, but the present disclosure is not limited thereto. For example, the growth inhibiting gas may be a diboran ($B_2H_6$) gas.

In the embodiments described above, the silane-based gas having the silicon number 1 is the $SiH_4$ gas, but the present disclosure is not limited thereto. For example, the silane-based gas having the silicon number 1 may be a silane-based gas in which a portion of the hydrogen (H) in the molecules of the $SiH_4$ gas is substituted with a halogen, such as fluorine (F), chlorine (Cl), bromine (Br), iodine (I), or the like. For example, the silane-based gas having the silicon number 1 may be a $SiF_4$ gas, a $SiHF_3$ gas, a $SiH_2F_2$ gas, a $SiH_3F$ gas, a $SiCl_4$ gas, a $SiHCl_3$ gas, a $SiH_2Cl_2$ (DCS) gas, a $SiH_3Cl$ gas, a $Si_2Cl_6$ gas, a $SiBr_4$ gas, a $SiHBr_3$ gas, a $SiH_2Br_2$ gas, a $SiH_3Br$ gas, a $SiI_4$ gas, a $SiHI_3$ gas, a $SiH_2I_2$ gas, or a $SiH_3I$ gas.

In the embodiments described above, the first film is the a-Si film and the second film is the $SiO_2$ film, but the present disclosure is not limited thereto. The first film and the second film may be formed of other materials, as long as the materials used for the first film and the second film are different. For example, the first film and the second film are films having different incubation times when forming the a-Si film. For example, the first film may be a silicon nitride film (SiN film), and the second film may be a $SiO_2$ film. For example, the substrate 101 may have one or more other films on the surface thereof in addition to the first film and the second film.

In the embodiments described above, the film forming apparatus is the batch-type apparatus that simultaneously performs processes on a plurality of substrates, but the present disclosure is not limited thereto. For example, the film forming apparatus may be a single wafer type apparatus that processes substrates one by one.

According to the present disclosure, it is possible to control a difference in film thicknesses between a silicon film formed on a first film and a silicon film formed on a second film when simultaneously forming the silicon films on the first film and the second film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method for forming a silicon film on a substrate, the film forming method comprising:
    preparing a substrate having a first film and a second film on a surface thereof;
    supplying a growth inhibiting gas that inhibits growth of the silicon film to the substrate, to cause physical adsorption of the growth inhibiting gas on the first film; and
    forming the silicon film on the first film and on the second film by supplying a silane-based gas having a silicon number 1 to the substrate having the growth inhibiting gas physically adsorbed on the first film,
    wherein the growth inhibiting gas is a phosphine gas or a diborane gas.

2. The film forming method as claimed in claim 1, wherein the growth inhibiting gas is supplied at a temperature lower than a thermal decomposition temperature of the growth inhibiting gas.

3. The film forming method as claimed in claim 1, wherein the first film and the second film are films having different incubation times when forming the silicon film.

4. The film forming method as claimed in claim 3, wherein the incubation time of the second film is longer than the incubation time of the first film.

5. The film forming method as claimed in claim 4, wherein the first film is a silicon film or a silicon nitride film, and
the second film is a silicon oxide film.

* * * * *